United States Patent
Brambilla

(10) Patent No.: US 7,166,892 B2
(45) Date of Patent: Jan. 23, 2007

(54) SHRUNK LOW ON-RESISTANCE DMOS STRUCTURE

(75) Inventor: Daniele Alfredo Brambilla, Sovico (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 227 days.

(21) Appl. No.: 11/005,635

(22) Filed: Dec. 6, 2004

(65) Prior Publication Data
US 2005/0151189 A1   Jul. 14, 2005

(30) Foreign Application Priority Data
Dec. 5, 2003   (EP) ................... 03425782

(51) Int. Cl.
*H01L 31/00*   (2006.01)
(52) U.S. Cl. .............. 257/335; 257/342; 257/344; 257/401
(58) Field of Classification Search ........... 257/335, 257/342, 344, 401; 438/266, 269
See application file for complete search history.

(56) References Cited

U.S. PATENT DOCUMENTS

| | | | |
|---|---|---|---|
| 5,719,421 A | 2/1998 | Hutter et al. | 257/335 |
| 5,736,766 A * | 4/1998 | Efland et al. | 257/338 |
| 5,825,065 A | 10/1998 | Corsi et al. | 257/328 |
| 6,137,140 A * | 10/2000 | Efland et al. | 257/343 |
| 6,538,281 B1 * | 3/2003 | Croce et al. | 257/335 |

FOREIGN PATENT DOCUMENTS

EP   1158583   11/2001

OTHER PUBLICATIONS

Patents Abstracts of Japan, vol. 005, No. 159, Oct. 14, 1981 & JP56088363A (Nec Corp.) Jul. 17, 1981.

* cited by examiner

*Primary Examiner*—Sara Crane
(74) *Attorney, Agent, or Firm*—Lisa K. Jorgenson; Allen, Dyer, Doppelt, Milbrath & Gilchrist, P.A.

(57) ABSTRACT

The on resistance per unit area of integration of a DMOS structure is reduced beyond the technological limits of a mask that is defined based upon the continuity of a heavily doped superficial silicon region along the axis of the elongated source island openings through the polysilicon gate layer in the width direction of the integrated structure. The mask no longer needs to be defined with a width (in the pitch direction) sufficiently large to account for the overlay of two distinct and relatively critical masks. These two masks are the source implant mask and the body contacting plug diffusion implant contact opening mask. Such a constraint of the prior techniques restricting the opening through the polysilicon gate layer to safely ensure an appropriate distance of the body connection plug diffusion dopant profile from the definition edges of the polysilicon is overcome by defining the body connection plug diffusion implant area by way of a mutual orthogonality between two no longer critical masks that may both be defined at minimum linewidth of the fabrication process.

16 Claims, 2 Drawing Sheets

SHRUNK LOW ON-RESISTANCE DMOS STRUCTURE

FIELD OF THE INVENTION

The present invention relates to integrated circuits, and in particular, to a compactly integrated DMOS structure with enhanced characteristics for withstanding high currents while retaining a low on-resistance.

BACKGROUND OF THE INVENTION

A DMOS structure includes a drain region, a source region and a gate defined over a channel region. In the case of an N-channel device, the source-body region is formed with respect to a purposely defined opening in a polysilicon gate layer, and includes a P-body diffusion formed inside an N− pocket. A single or, more commonly, a shallow N− and a deeper N+ source diffusion are formed in succession in the P-body region. This is done by successive implants self-aligned to the definition edges of the poly (gate) opening and to the dielectric spacers successively formed there along according to well known VLSI and ULSI fabrication techniques. A source contact is formed on the N+ source diffusion. Of course, the types of conductivities are inverted in the case of a P-channel device.

Problems arise from the fact that in operation, and especially at relatively high currents, the potential of the N+ source diffusion tends to differ from the potential of the P-body diffusion containing it. These problems are addressed by locally short-circuiting the N+ source diffusion to the P-body by forming an electrical connection using a dedicated electrical connection P+ diffusion that extends in depth through the N+ source diffusion reaching down to the P-body region. This P+ diffusion of electrical connection is short-circuited to the N+ diffusion by a source contact formed thereon. Of course, the same considerations hold also for a P-channel device that is formed by inverting the types of conductivity (dopants) of the various regions.

With the advent of ULSI technologies, the size of the contacts has been reduced to allow for a greater density of integration, and as a result, the N+ and P+ diffusions could hardly be short-circuited using a single contact having a minimized or reduced cross section. Therefore, ULSI DMOS structures (N-channel or P-channel) generally have source regions provided with a plurality of minimum size contacts formed on the (N+ or P+) source diffusions, and larger size contacts on the local plug diffusions (P+ or N+) providing electrical connection to the body region. The local short-circuit between the P+ and N+ diffusions is established through the common source contact metallization.

Even a residual drawback of this approach causes current density non-uniformities in the source region because of charge carriers (electrons and holes) being collected through distinct contacts. This reduces the robustness of the device when operating at high currents because of a premature turning on of the intrinsic parasitic bipolar junctions transistor (NPN or PNP). This problem was successfully addressed by the invention disclosed in European patent application 158,583, which is incorporated herein by reference in its entirety and is assigned to the current assignee of the present invention.

According to the '583 patent application, an electrically conductive layer of silicide formed in a self-aligned manner (i.e., SAlicide) over the whole silicon surface in the source region area, effectively short-circuits the source (N+ or P+) diffusion and the plug diffusion (P+ or N+) of the electrical connection of the underlying body region. This is while the electric current eventually flows through one or more contacts formed on the silicide layer. According to a preferred embodiment of this technique, at least one source contact is projectively formed over the area of the plug diffusion (P+ or N+) of the electrical connection.

The layout of the contacts in the source region influences the on-resistance of integrated DMOS devices. For a typical layout of a DMOS device, the on-resistance per unit area of integration is proportional to the pitch distance between the source contacts and the drain contacts, and is inversely proportional to the width W of the drain and source regions. For a given width W of the drain and source regions, the on-resistance per unit area of integration may be lowered by reducing as much as possible the distance between such regions within the limits imposed by the manufacturing technology.

The layout of a DMOS structure is practically symmetrical for p-channel and n-channel devices. Basically, the layout is defined by four masks: the body mask which defines the opening through the polysilicon gate layer in correspondence to the source/body region of the structure; the contact (opening) and source (island) masks that are commonly designed at minimum lithographical dimensions; and the body contact mask, by which a sufficient effective distance from the polysilicon (gate electrode) edge of the plug of heavily doped silicon of a conductivity type opposite to that of the surrounding source region, reaching down in depth to contact the underlying body region, is defined to ensure adequate voltage withstanding characteristics.

Although the use of a SAlicide layer, with at least one source-body contact formed thereon, and if required, a plurality of spaced apart source contacts formed along the central axis in the width direction W of the opening through the polysilicon, has significantly helped in enhancing the resulting conductivity of an integrated DMOS structure. This has been accomplished in a very even distribution of the lines of current in the silicon toward the multiple source contacts, and reduces the width and pitch of the structure for comparable electrical performances. This approach has imposed the requisite of providing for the presence of a continuous heavily doped superficial region within the source region definition opening through the polysilicon to achieve an optimization of conduction characteristics. In fact, formation of a highly conductive layer of SAlicide thereon is favored by the presence of heavily doped silicon at the surface.

Such a requisite is generally fulfilled by the continuity of the relatively heavily doped source area implant (N+) surrounding the area of definition of the body contact plug diffusion. This area needs to be masked from the heavy source implant by a resist cap or island. This ensures continuity of a heavily doped silicon surface area along the W direction of the opening through the polysilicon layer.

Of course, the two sides of the body contact plug diffusion heavily implanted with a dopant (P+) of an opposite type of conductivity to that of the (N+) source dopant is to remain at a sufficient distance from the definition edge of the polysilicon (gate electrode) to preserve voltage withstanding characteristics of the integrated structure.

Therefore, on account of the alignment tolerances of three distinct masks that are normally used, the width of the opening in the polysilicon is to be made sufficiently large for ensuring a sufficient distance of separation between the side of the central mask window used for implanting the body contact plug diffusion dopant from the definition edge of the poly (gate). This inevitably limits the possibility of reducing the width in the pitch direction of the elongated openings through the polysilicon gate layer. The three distinct masks are as follows: the heavy source N+ implant mask for defining the area of the body contact plug diffusion; the contact opening mask; and the mask for implanting the dopant of the body contact plug diffusion and of the overlay that needs to be considered.

These technological constraints relative to the definition of features within the poly openings of the source regions limit the possibility of further reducing the pitch of integration, and therefore, of the overall level of compactness that can be achieved with a certain manufacturing technology. Also, the ability to reduce the on-resistance for unit area of integration of the structure is similarly limited.

SUMMARY OF THE INVENTION

In view of the foregoing background, an object of the present invention is to overcome the above-noted limitations of known integrated DMOS structures and the corresponding fabrication processes.

This and other objects, advantages and features in accordance with the present invention are provided by significantly reducing the pitch of integration of a DMOS structure and/or significantly increasing the on-resistance per unit area of integration of the structure while preserving adequate voltage withstanding characteristics of the integrated structure by reducing the width (in the pitch direction) of the opening through the polysilicon gate layer in correspondence to each body-source island far beyond the limits imposed in the structures made according to the prior art, for the reasons mentioned above.

The invention rests on a finding that continuity of the heavily doped superficial silicon region along the axis of the elongated source island openings through the polysilicon gate layer in the width direction (W) of the integrated structure no longer needs to be assured by defining it with a width (in the pitch direction) sufficiently large to account for the overlay of two distinct and relatively critical masks, namely: the source implant mask and the body contacting plug diffusion implant contact opening mask. These masks are responsible for limiting the possibility of restricting the opening through the polysilicon gate layer to safely ensure an appropriate distance of the body connection plug diffusion dopant profile from the definition edges of the polysilicon.

Contrary to the integrated structures of the prior art, the body connection plug diffusion implant area is, according to the invention, defined by a mutual orthogonality between two no longer critical masks that may both be defined at minimum linewidth of the fabrication process.

Accordingly, the source implant mask defines within the opening through the polysilicon gate a certain area in the form of a strip orthogonal to the width direction (W) and extending across the opening through the polysilicon gate layer that is masked from the source implant, and that therefore, receives only a first shallow light doping (LDD) source implant before formation of the dielectric spacers on the definition edges of the opening through the polysilicon gate layer. For the fullest compactness enhancement afforded by the invention, such an orthogonal masked strip may be defined at minimum linewidth of the fabrication process. However, the width of such a source implant mask extending across the opening through the polysilicon gate layer, that is orthogonal with respect to the width direction (W) of the integrated structure, may even be larger than the minimum linewidth with which will be successively defined the source contact metal.

Similarly, the mask of the body connection plug diffusion area implant defining an implant window in the form of a continuous strip along the central axis in the width direction (W) of the opening through the polysilicon gate layer may be defined at minimum linewidth.

Differently from the existing techniques, the linewidth of definition of the two masks of the heavy source implant area and of the body connection plug diffusion implant area (the latter being defined in the crossover area of the orthogonal implant windows of the two masks) may both be the same as the width of definition of the source contact to be formed on the layer of salicide in correspondence to the body contact plug diffusion. Most advantageously, the linewidth may be the minimum afforded by the fabrication process.

Of course, the implanted dopant of the body connection plug diffusion is received along such a central strip of minimum linewidth also by the heavily doped silicon of the source region without inverting the type of conductivity thereof.

By defining the implant window of the body connection plug diffusion dopant as an orthogonal strip of minimum linewidth, instead of a centered island area, the need of accounting for an adequate overlay is eliminated and overall renders the two masks that define (at their crossover) the implant area of the plug diffusion no longer critical.

It has been found that any "necking" of the most conductive portion of the area of the successively deposited silicide layer does not affect in any significant manner the electrical conduction behavior of the source contacts and of the body-source short-circuiting provided by the silicide layer. This may be a result of a reduced concentration of dopant present at the surface of the silicon from the diffusion profile line of the body contact play diffusion dopant to the edge of definition of the gate polysilicon in correspondence to the orthogonal strip of definition of minimum linewidth of the source implant mask,

BRIEF DESCRIPTION OF THE DRAWINGS

The various aspects and advantages of the invention will become even clearer through a detailed description of an important embodiment of the invention in integrating a lateral DMOS transistor structure (LDMOS), though the invention may obviously be practiced and is beneficial also for integrating a vertical DMOS transistor structure (VDMOS) according to modern VLSI and ULSI fabrication technologies, and by referring to the attached drawings, wherein.

DETAILED DESCRIPTION OF THE PREFERRED EMBODIMENTS

A basic layout view of an integrated LDMOS N-channel structure according to the present invention is shown in FIG.

Figure 2:
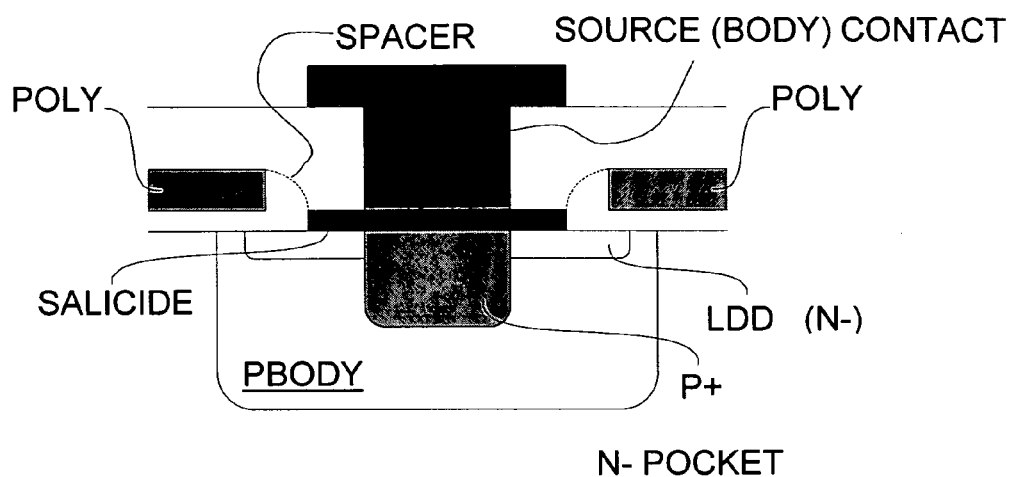
FIG. 2 is a partial cross-sectional view in the plane A—A of FIG. 1.
Figure 3:
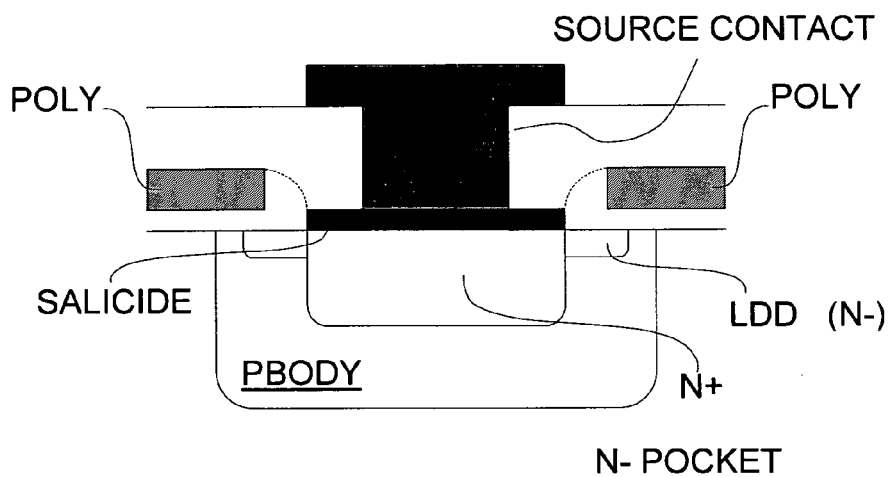
FIG. 3 is a partial cross-sectional view in the plane B—B of FIG. 1.

1, while FIGS. 2 and 3 are partial cross-sectional views along the section planes A—A and B—B, respectively.

Figure 1:
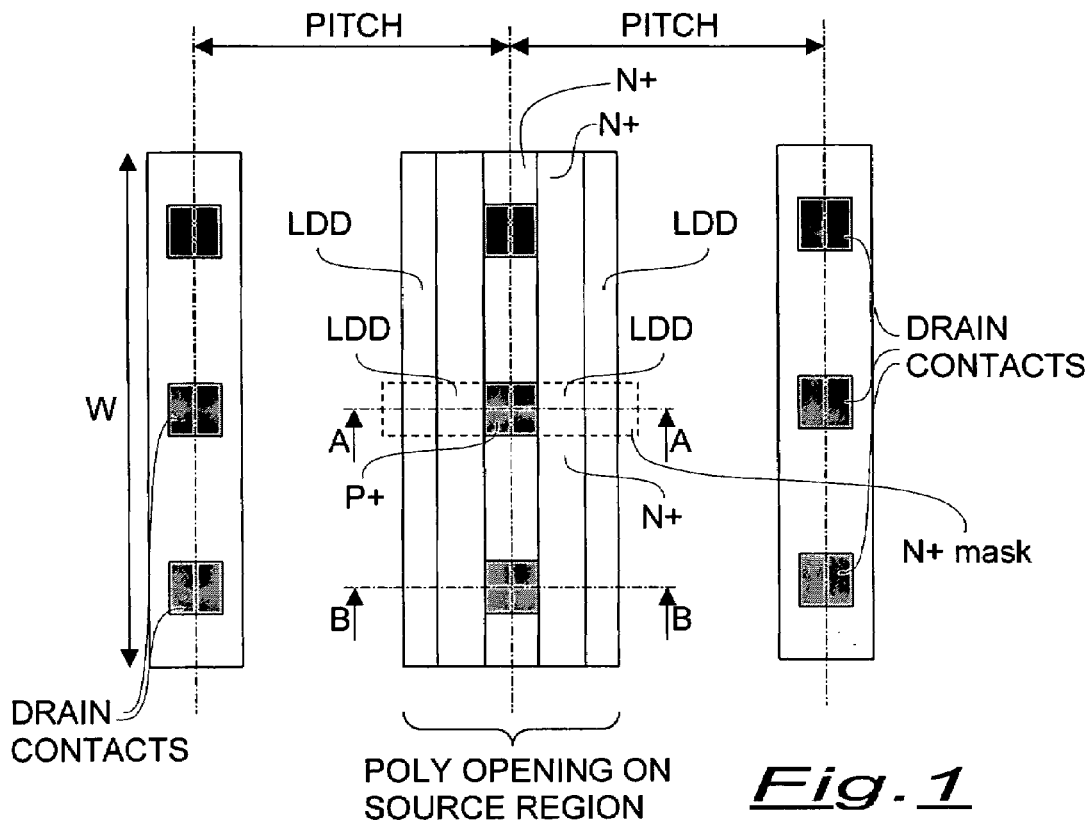
FIG. 1 is a schematic layout of an LDMOS structure according to the invention.

As may be clearly observed in the layout view of FIG. 1, the N+ mask used for implanting the source region in self-alignment with the spacers formed on the edges of definition of the opening through the polysilicon gate layer (POLY), masks from the N+ implant an orthogonal strip across the full width of the poly opening, practically leaving in the masked area only the LDD N− source diffusion. This represents a discontinuity of the N+ source diffusion in the source region defined by the opening through the polysilicon layer, along with the W direction of the integrated LDMOS structure.

According to a preferred embodiment, the N+ mask may be defined with the minimum linewidth of the process of fabrication, like the source contacts.

Another feature of the structure of the invention is represented by the fact that the P+ mask that is used for implanting the P+ dopant in the crossover area with the N+ mask is also defined with the minimum linewidth, centered about the central axis of the source region in the W direction. The P+ mask forms the body connection plug diffusion P+ and eventually also increases the total dopant species concentration in the silicon region extending along the central axis of the source region in the width direction W of the integrated structure without inverting the type of conductivity conferred to it by the higher N+ source implant.

In this way, the body connection plug diffusion P+ is defined by way of the orthogonality of the two masks N+ and P+ (crossover area), without accounting for any overlay that by contrast was necessary to account for in the known process.

According to such a preferred embodiment, the width of the longitudinal central strip of the N+ source region that eventually receives also the P+ dopant in an amount short of compensation of the N+ heavy source doping has a minimum linewidth, like the N+ mask and the source contact mask.

The no longer critical character of the masks and the resulting elimination of overlays permits a significant reduction of the transversal width of the openings through the polysilicon gate layer, and consequently, a reduction of the pitch of integration.

For a sample implementation with a linewidth of definition of the source contact areas and of the implant window of the body connection plug diffusion dopant of 0.4 μm, according to the prior art method, the width of the longitudinal central strip of the source region, receiving the heavy implants of dopants having an opposite type of conductivity, because of the necessary overlays of about 0.1 μm on each side, would become 0.6 μm. By considering the spacers, the total width of the poly opening will be about 1.2 μm.

In contrast, according to the novel method of the invention, for the same linewidth of definition of the source contact areas and of the implant window of the body connection plug diffusion dopant, the fact that the overlays mentioned above are no longer required, permits the width of the poly openings of source areas to narrow to about 0.8 μm. This is practically ⅔ of the width that was necessary in the prior process.

In general, according to present fabrication technologies of power DMOS devices, the minimum linewidth of definition used ranges from 0.3 to 0.8 μm, and according to the known definition approach, the overlays in defining the width of the longitudinal central strip area of a source island, range from 0.1 to 0.3 μm and the lateral extension of dielectric spacers may range from 0.2 to 0.9 μm. In any case, the novel approach forms the required short circuiting of the body region to the source contacts. This allows for a significant reduction of the width of the poly openings of the source islands, and therefore, a consistent shrinkage of the whole DMOS structure.

It has been found that the effect of the presence of only a lightly doped (LDD) source region associated with the orthogonal strip of minimum linewidth of the N+ mask used for the definition and formation of the P-body connection plug diffusion P+, does not affect in any detectable manner the electrical conducting behavior of the source contacting structure and local body-source shortcircuiting afforded by the presence of a conductive layer of silicide, SALICIDE.

Figure 4:
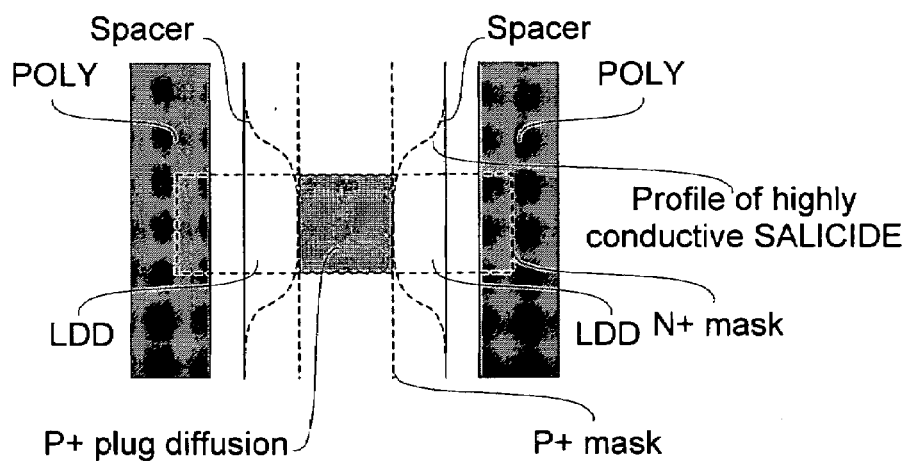
FIG. 4 is a pictorial representation of the effects of the absence of a heavy source implant along the orthogonal minimum linewidth masked area across the opening through the polysilicon.

Although theoretically an effect of the type that has been pictorially illustrated in FIG. 4 and which may be summarized in the "necking" effect in coincidence of the LDD zones of minimum linewidth bridging the space of separation between the body connection plug diffusion definition area and the definition edge of the polysilicon gate layer, of the highly conductive silicide layer deposited on the silicon surface in the source region may be present, does not jeopardize an effective electrical continuity with the body short circuiting plug diffusion. There is also an overall negligible detrimental effect in maintaining a substantial equal potential of the source contacting and body-source short-circuiting silicide structure.

In other words, the highly conductive silicide layer remains electrically continuous along the width direction W of the source region of the integrated LDMOS structure, notwithstanding the local discontinuity deliberately caused in the N+ source diffusion and the consequential presence of local lightly doped zones at the surface of the silicon, between the heavily doped central area of the P+ plug diffusion and the opposing edge of the gate electrode (POLY).

Of course, all the considerations that have been made with reference to the drawings referring to the realization of an N-channel device, hold also for the case of a P-channel device, by simply inverting the type of polarity of the dopants. Differences between N-channel and P-channel devices reversibly depend on whether, for the fabrication process being used, the N+ junction is higher (as in the illustrated example) or lower in doping compared to the P+ junction, as will be obvious to a person skilled in the art.

The effectiveness of the improved DMOS structure of the invention has been demonstrated for a number of different devices and the respective area savings that were obtained, for a minimum linewidth embodiment, are reported in the following table, in which are also compared the pitch of integration of structures made according to the prior art with the pitch of integration of the improved DMOS structure (SMART) made according to the present invention.

|       | Device        | Standard pitch [μm] | SMART pitch [μm] | Area gain |
|-------|---------------|---------------------|------------------|-----------|
| POWER | 5 V N LDMOS   | 4.0                 | 3.0              | 25%       |
|       | 12 V N LDMOS  | 5.8                 | 5.0              | 14%       |
|       | 20 V N LDMOS  | 6.2                 | 5.4              | 13%       |
|       | 45 V N LDMOS  | 10.0                | 9.2              | 8%        |
|       | 60 V N LDMOS  | 12.8                | 12.0             | 6%        |
|       | 5 V P LDMOS   | 5.3                 | 4.3              | 19%       |
|       | 16 V P LDMOS  | 5.4                 | 4.6              | 15%       |
|       | 20 V P LDMOS  | 5.4                 | 4.6              | 15%       |
| LOGIC | 3.3 V N MOS   | 1.55                | 1.30             | 16%       |
|       | 3.3 V P MOS   | 1.55                | 1.30             | 16%       |

Preliminary bench measurements on a first prototype lot of wafers (smart pitch) confirmed a lower on-resistance per unit area of integration, an equal or higher transconductance and an equal or higher breakdown voltage, compared to the devices made according to the prior art (standard pitch).

That which is claimed is:

1. A DMOS structure comprising:
   a semiconductor substrate; and
   a region of a first type of conductivity in said semiconductor substrate and comprising a gate layer, and drain and source regions spaced apart in a first direction;
   each source region formed based upon a defined opening through said gate layer, the opening being elongated in the first direction and comprising
      a body diffusion region of a second type of conductivity implanted in self-alignment to edges of the opening through said gate layer,
      a first source diffusion region of the first type of conductivity implanted in self-alignment to the edges of the opening through said gate layer,
      spacers adjacent the edges of the opening through said gate layer,
      a second source diffusion region of the first type of conductivity implanted in self-alignment to edges of said dielectric spacers,
      a central area in said second source diffusion region void of a second source diffusion implant used for defining said second source diffusion region,
      a body connection plug diffusion region of the second type of conductivity in said central area and extending down to said body diffusion region,
      a silicide layer on said first and second source diffusion regions and on said body connection plug diffusion region,
      a source contact on said silicide layer and over said body connection plug diffusion region, and
      said central area in the form of a strip orthogonal to the first direction and extending across the opening in said gate layer, said central area and an area of said body connection plug diffusion region along a central axis of the opening through said gate layer having a same linewidth of definition as said source contact.

2. A DMOS structure according to claim 1, wherein the linewidth of definition is a minimum linewidth based upon a fabrication process forming the DMOS structure.

3. A DMOS structure according to claim 2, wherein the linewidth of definition is within a range of about 0.30 to 0.80 μm.

4. A DMOS structure according to claim 1, wherein said gate layer comprises polysilicon.

5. A DMOS structure according to claim 1, wherein sidewalls of said source contact are aligned with sidewalls of said body connection plug diffusion region.

6. A method for reducing a pitch of integration of a DMOS structure comprising:
   forming a region of a first type of conductivity in a semiconductor substrate and comprising a gate layer, and drain and source regions spaced apart in a first direction; and
   each source region being based upon a defined opening through the gate layer with the opening being elongated in the first direction, and forming each source region comprising
      forming a body diffusion region of a second type of conductivity in self-alignment to edges of the opening through the gate layer,
      forming a first source diffusion region of the first type of conductivity in self-alignment to the edges of the opening through the gate layer,
      forming spacers adjacent the edges of the opening through the gate layer,
      forming a second source diffusion region of the first type of conductivity in self-alignment to edges of the dielectric spacers,
      defining a central area in the second source diffusion region void of a second source diffusion implant used for defining the second source diffusion region,
      forming a body connection plug diffusion region of the second type of conductivity in the central area and extending down to the body diffusion region,
      forming a silicide layer on the first and second source diffusion regions and on the body connection plug diffusion region,
      forming a source contact on the silicide layer and over the body connection plug diffusion region, and
      the central area being defined in the form of a strip orthogonal to the first direction and extending across the opening in the gate layer based upon a crossover of a mask used for the second source diffusion region defining a first strip orthogonal to the first direction, and a mask for the body connection plug diffusion region defining a second strip in the first direction, the first and second strips having a same linewidth.

7. A method according to claim 6, wherein the linewidth of definition is a minimum linewidth based upon a fabrication process forming the DMOS structure.

8. A method according to claim 7, wherein the linewidth of definition is within a range of about 0.30 to 0.80 μm.

9. A method according to claim 6, wherein said gate layer comprises polysilicon.

10. A method according to claim 6, wherein sidewalls of said source contact are aligned with sidewalls of said body connection plug diffusion region.

11. A method for forming a body/source connection within a source region of a DMOS structure comprising:
   forming a region of a first type of conductivity in a semiconductor substrate and comprising a gate layer, and drain and source regions spaced apart in a first direction; and
   each source region being based upon a defined opening through the gate layer with the opening being elongated in the first direction, and forming each source region comprising
      forming a body diffusion region of a second type of conductivity in self-alignment to edges of the opening through the gate layer,
      forming a first source diffusion region of the first type of conductivity in self-alignment to the edges of the opening through the gate layer,
      forming spacers adjacent the edges of the opening through the gate layer,
      forming a second source diffusion region of the first type of conductivity in self-alignment to edges of the dielectric spacers,
      defining a central area in the second source diffusion region void of a second source diffusion implant used for defining the second source diffusion region,
      forming a body connection plug diffusion region of the second type of conductivity in the central area and extending down to the body diffusion region,
      forming a silicide layer on the first and second source diffusion regions and on the body connection plug diffusion region for the body/source connection, forming a source contact on the silicide layer and over the body connection plug diffusion region, and the central area in the form of a strip orthogonal to the first direction and extending across the opening in the gate layer, the central area and an area of the body connection plug diffusion region along a central axis of the opening through the gate layer having a same linewidth of definition as the source contact.

12. A method according to claim 11, wherein the central area is defined based upon a crossover of a mask used for the second source diffusion region defining a first strip orthogonal to the first direction, and a mask for the body connection plug diffusion region defining a second strip in the first direction, the first and second strips having a same linewidth.

13. A method according to claim 11, wherein the linewidth of definition is a minimum linewidth based upon a fabrication process forming the DMOS structure.

14. A method according to claim 13, wherein the linewidth of definition is within a range of about 0.30 to 0.80 μm.

15. A method according to claim 11, wherein said gate layer comprises polysilicon.

16. A method according to claim 11, wherein sidewalls of said source contact are aligned with sidewalls of said body connection plug diffusion region.

* * * * *